(12) United States Patent
Sheng et al.

(10) Patent No.: US 11,925,012 B2
(45) Date of Patent: Mar. 5, 2024

(54) CAPACITOR ARRAY STRUCTURE AND METHOD FOR FORMING THE SAME

(71) Applicant: CHANGXIN MEMORY TECHNOLOGIES, INC., Hefei (CN)

(72) Inventors: Chaojun Sheng, Hefei (CN); Wenjia Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 452 days.

(21) Appl. No.: 17/310,416

(22) PCT Filed: Mar. 1, 2021

(86) PCT No.: PCT/CN2021/078406
§ 371 (c)(1),
(2) Date: Aug. 1, 2021

(87) PCT Pub. No.: WO2021/179926
PCT Pub. Date: Sep. 16, 2021

(65) Prior Publication Data
US 2022/0320095 A1    Oct. 6, 2022

(30) Foreign Application Priority Data

Mar. 12, 2020 (CN) .......................... 202010169180.1

(51) Int. Cl.
*H10B 12/00* (2023.01)
*H01L 21/768* (2006.01)
(Continued)

(52) U.S. Cl.
CPC ....... *H10B 12/03* (2023.02); *H01L 21/76829* (2013.01); *H01L 23/5222* (2013.01);
(Continued)

(58) Field of Classification Search
CPC ........ H10B 12/09; H10B 12/30; H10B 12/50; H10B 12/033; H01L 28/90; H01L 28/86;
(Continued)

(56) References Cited

U.S. PATENT DOCUMENTS 9,349,736 B2 * 5/2016 Hung .................. H01L 21/7682
10,217,569 B2 * 2/2019 Komeda ................ H01G 4/012
(Continued)

FOREIGN PATENT DOCUMENTS

CN    107731794 A    2/2018
CN    107968044 A    4/2018
(Continued)

OTHER PUBLICATIONS

First Office Action of the Chinese application No. 202010169180.1, dated Dec. 29, 2021.
(Continued)

*Primary Examiner* — Bilkis Jahan
*Assistant Examiner* — Victor V Barzykin
(74) *Attorney, Agent, or Firm* — Syncoda LLC; Feng Ma

(57) ABSTRACT

A method for forming a capacitor array structure includes the following steps: providing a substrate, a capacitor contact being exposed on a surface of the substrate, and the substrate including an array region and a peripheral region; forming a bottom supporting layer covering the substrate and the capacitor contact, the bottom supporting layer having a gap therein; forming a filling layer filling the gap and covering the capacitor contact and the surface of the bottom supporting layer, a thickness of the filling layer located at the peripheral region being larger than that of the filling layer located at the array region; forming supporting layers and sacrificial layers alternately stacked in a direction perpen-
(Continued)

dicular to the substrate; forming a capacitor hole; sequentially forming a lower electrode layer on an inner wall of the capacitor hole.

12 Claims, 8 Drawing Sheets

(51) Int. Cl.
*H01L 23/522* (2006.01)
*H01L 49/02* (2006.01)
*H01L 27/08* (2006.01)

(52) U.S. Cl.
CPC .............. *H01L 28/86* (2013.01); *H01L 28/90* (2013.01); *H10B 12/033* (2023.02); *H10B 12/09* (2023.02); *H10B 12/30* (2023.02); *H10B 12/50* (2023.02); *H01L 27/0805* (2013.01)

(58) Field of Classification Search
CPC ........... H01L 21/76829; H01L 23/5222; H01L 27/0805; H01L 2221/1052
See application file for complete search history.

(56) References Cited

U.S. PATENT DOCUMENTS

| | | | | |
|---|---|---|---|---|
| 2002/0024085 A1* | 2/2002 | Nakamura | ......... | H10B 12/0335 257/306 |
| 2004/0197991 A1 | 10/2004 | Lee et al. | | |
| 2005/0093046 A1* | 5/2005 | Ahn | ...................... | H10B 12/033 257/296 |
| 2006/0014344 A1* | 1/2006 | Manning | .............. | H10B 12/033 438/243 |
| 2010/0187101 A1* | 7/2010 | Kim | ......................... | H01L 28/90 204/192.32 |
| 2013/0230961 A1* | 9/2013 | Kim | ...................... | H10B 12/033 438/381 |
| 2016/0073502 A1* | 3/2016 | Lee | ...................... | H01L 27/0805 174/260 |
| 2018/0358428 A1* | 12/2018 | Park | ......................... | H01L 28/91 |
| 2021/0408225 A1* | 12/2021 | Seo | .......................... | H01L 28/75 |
| 2022/0285204 A1* | 9/2022 | Lu | ..................... | H01L 21/76224 |
| 2022/0415028 A1* | 12/2022 | Seo | ........................ | G06V 10/778 |

FOREIGN PATENT DOCUMENTS

| | | |
|---|---|---|
| CN | 108010913 A | 5/2018 |
| CN | 207517677 U | 6/2018 |
| CN | 108538822 A | 9/2018 |
| CN | 208142182 U | 11/2018 |
| CN | 109065501 A | 12/2018 |
| CN | 109065521 A | 12/2018 |
| CN | 208271885 U | 12/2018 |
| CN | 109698274 A | 4/2019 |
| CN | 208738234 U | 4/2019 |
| CN | 208753321 U | 4/2019 |
| CN | 109841623 A | 6/2019 |
| CN | 209087830 U | 7/2019 |

OTHER PUBLICATIONS

Notice of Allowance of the Chinese application No. 202010169180.1, dated Feb. 14, 2022.
English translation of the Written Opinion of the International Search Authority in the international application No. PCT/CN2021/078406, dated May 24, 2021.
International Search Report in Application No. PCT/CN2021/078406, dated May 24, 2021.

* cited by examiner

CAPACITOR ARRAY STRUCTURE AND METHOD FOR FORMING THE SAME

CROSS-REFERENCE TO RELATED APPLICATIONS

This application is a national stage of International Application No. PCT/CN2021/078406 filed on Mar. 1, 2021, which claims priority to Chinese Patent Application No. 202010169180.1. filed on Mar. 12, 2020. The disclosures of these applications are hereby incorporated by reference in their entirety.

FILED OF THE INVENTION

The present application relates to the field of semiconductor manufacturing technologies, in particular to a capacitor array structure and a method for forming the same.

BACKGROUND

A dynamic random access memory (DRAM) is a common semiconductor structure in electronic equipment, such as a computer, and is formed by a plurality of memory cells, each of which usually includes a transistor and a capacitor. The transistor has a gate electrically connected to a wordline, a source electrically connected to a bit line, and a drain electrically connected to the capacitor, and a wordline voltage on the wordline may control the transistor to be turned on and off, such that data information stored in the capacitor may be read through the bit line, or data information may be written into the capacitor through the bit line.

Usually, in a manufacturing process of a capacitor array structure, after formation of a capacitor contact, laminated structures, such as a bottom supporting layer, a sacrificial layer, or the like, are directly formed on a surface of the capacitor contact, a capacitor hole is then formed with an etching process, and finally, a lower electrode, a dielectric layer and an upper electrode are formed in the capacitor hole. However, due to process limitations, a gap often exists in the formed bottom supporting layer. In a subsequent process of high temperature deposition of the dielectric layer, the dielectric layer may diffuse into the gap of the bottom supporting layer, thereby forming a parasitic capacitance with the capacitor contact, resulting in an aggravated delay effect.

Therefore, how to improve the capacitor array structure, prevent the dielectric layer and the capacitor contact from forming the parasitic capacitance, and alleviate the delay effect, thereby improving a performance of the DRAM is a technical problem urgent to be solved currently.

SUMMARY

The present application provides a capacitor array structure and a method for forming the same, which are used for solving a serious delay effect of an existing capacitor array structure to improve a performance of a DRAM.

In order to solve the above-mentioned problem, the present application provides a method for forming a capacitor array structure, including the following steps:
providing a substrate, a capacitor contact being exposed on a surface of the substrate, the substrate including an array region and a peripheral region, and the capacitor contact being located at the array region;
forming a bottom supporting layer covering the substrate and the capacitor contact, the bottom supporting layer having a gap therein;
forming a filling layer filling the gap and covering the capacitor contact and a surface of the bottom supporting layer, a thickness of the filling layer located at the peripheral region being larger than that of the filling layer located at the array region;
forming supporting layers and sacrificial layers alternately stacked in a direction perpendicular to the substrate;
forming a capacitor hole at least penetrating through the supporting layer and the sacrificial layer and exposing the capacitor contact; and
sequentially forming a lower electrode layer on an inner wall of the capacitor hole, a dielectric layer on a surface of the lower electrode layer and an upper electrode layer on a surface of the dielectric layer to form a capacitor.

Optionally, the step of forming a filling layer at least filling the gap includes:
etching back the bottom supporting layer to expose the capacitor contact; and
forming the filling layer filling the gap and covering the capacitor contact and the surface of the bottom supporting layer.

Optionally, the step of forming the filling layer filling the gap and covering the capacitor contact and the surface of the bottom supporting layer includes:
forming a first sublayer filling the gap;
forming a second sublayer covering the capacitor contact, the bottom supporting layer and a surface of the first sublayer to form the filling layer including the first sublayer and the second sublayer.

Optionally, the thickness of the filling layer located at the peripheral region is 10 nm to 40 nm greater than the thickness of the filling layer located at the array region.

Optionally, the step of forming a capacitor hole at least penetrating through the supporting layer and the sacrificial layer and exposing the capacitor contact includes:
forming, in the array region, the capacitor hole penetrating through the supporting layer, the sacrificial layer and the filling layer and exposing the capacitor contact.

Optionally, the step of forming a capacitor includes:
forming the lower electrode layer on the inner wall of the capacitor hole;
removing part of the supporting layers and all the sacrificial layers to expose the filling layer; and
forming the dielectric layer covering the surface of the lower electrode layer and the surface of the filling layer and the upper electrode layer covering the surface of the dielectric layer.

Optionally, the filling layer is made of one or any combination of silicon nitride, polycrystalline silicon, silicon oxynitride, and silicon carbonitride.

In order to solve the above-mentioned problem, the present application further provides a capacitor array structure, including:
a substrate, a capacitor contact being exposed on a surface of the substrate, the substrate including an array region and a peripheral region, and the capacitor contact being located at the array region;
a bottom supporting layer covering a surface of the substrate and a side wall of the capacitor contact, the bottom supporting layer having a gap therein;
a filling layer filling the gap and covering the capacitor contact and the surface of the bottom supporting layer, a thickness of the filling layer located at the peripheral region being larger than that of the filling layer located at the array region;

a capacitor including a lower electrode layer located on the substrate and electrically connected to the capacitor contact, a dielectric layer covering a surface of the lower electrode layer and an upper electrode layer covering a surface of the dielectric layer; and a plurality of supporting layers connected to a side wall of the lower electrode layer.

Optionally, the thickness of the filling layer located at the peripheral region is 10 nm to 40 nm greater than the thickness of the filling layer located at the array region.

Optionally, the dielectric layer further covers a surface of the filling layer and a surface of the supporting layer; the capacitor array structure further includes:

a conducting layer covering a surface of the upper electrode layer.

Optionally, the filling layer includes:

a first sublayer filling the gap; and a second sublayer covering the bottom supporting layer, the capacitor contact and a surface of the first sublayer.

Optionally, the filling layer is made of one or any combination of silicon nitride, polycrystalline silicon, silicon oxynitride, and silicon carbonitride.

With the capacitor array structure and the method for forming the same according to the present application, the filling layer is formed to fill the gap in the bottom supporting layer and cover the capacitor contact and the surface of the bottom supporting layer, thereby reducing or even solving the problem that the dielectric layer diffuses to the bottom supporting layer to form a parasitic capacitance with the capacitor contact in the process of forming the dielectric layer, alleviating the delay effect of the capacitor array structure, and improving the performance of the DRAM. Moreover, the thickness of the filling layer located at the peripheral region is set to be larger than that of the filling layer located at the array region, such that the bottom supporting layer at the peripheral region may be effectively prevented from being damaged in the subsequent treatment process, and a conductive structure at a bottom of the peripheral region is protected, thereby guaranteeing a stability of the performance of the DRAM.

DETAILED DESCRIPTION

Figure 1:
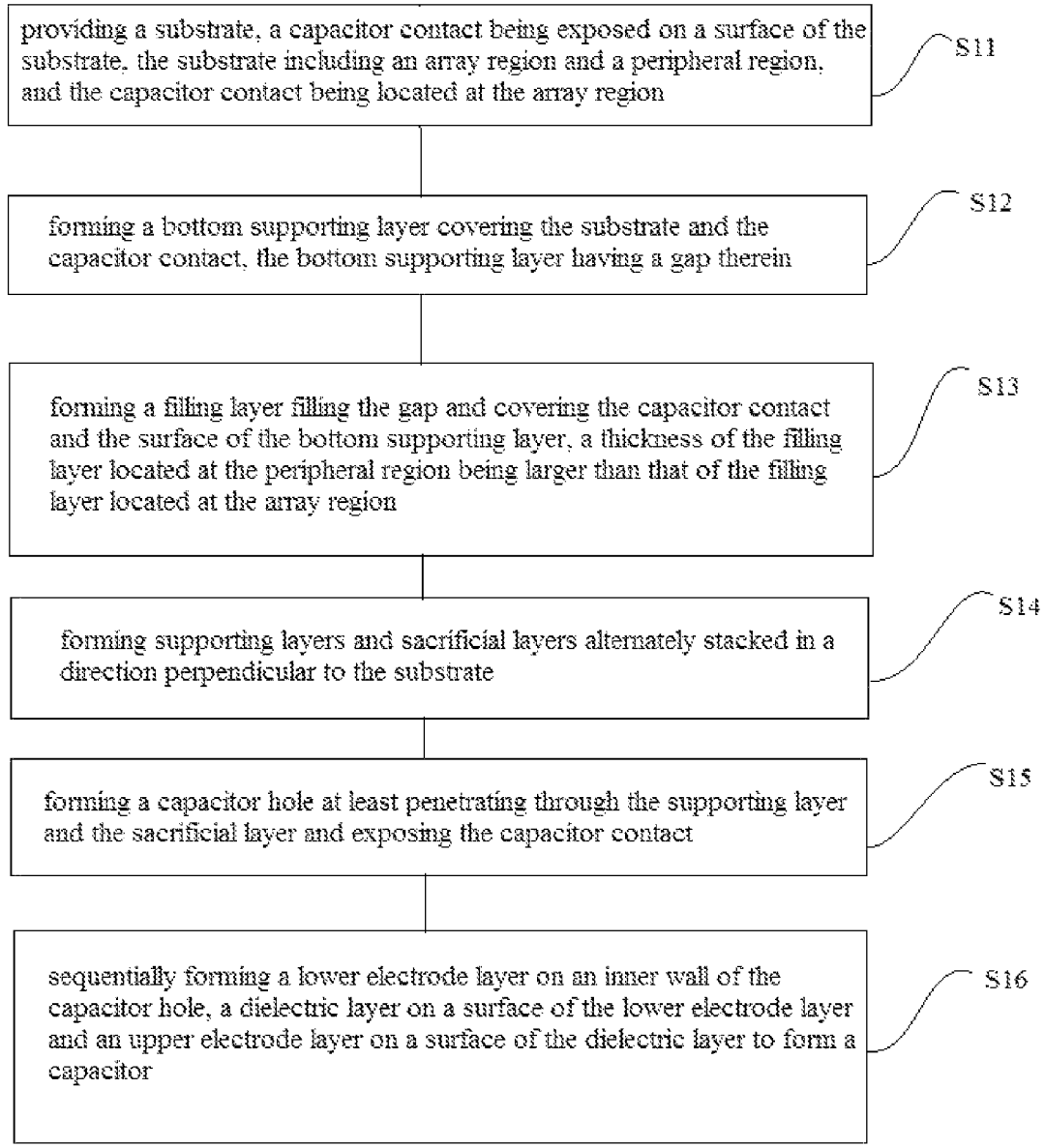
FIG. 1 is a flow chart of a method for forming a capacitor array structure according to an embodiment of the present application.
Figure 2A:
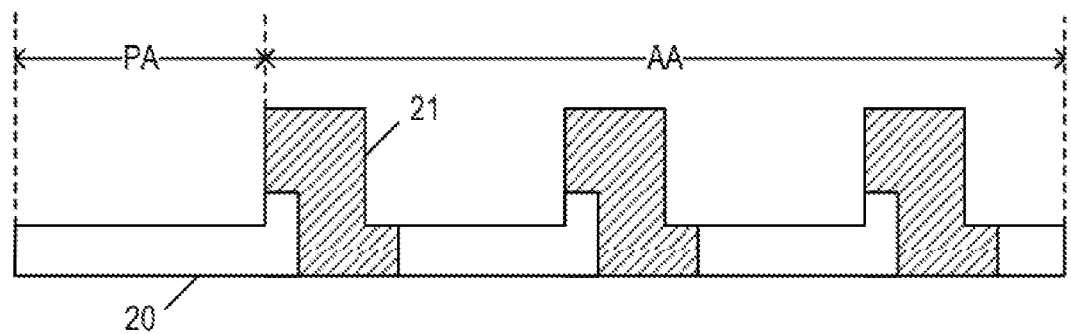
FIG. 2A is a first schematic sectional view of main processes for forming a capacitor array structure according to an embodiment of the present application.

The technical solutions in the embodiments of the present application will be described below with reference to the drawings in the embodiments of the present application. An embodiment of the present application provides a method for forming a capacitor array structure. FIG. 1 is a flow chart of the method for forming a capacitor array structure according to an embodiment of the present application, and FIGS. 2A to 2K are schematic sectional views of main processes for forming a capacitor array structure according to an embodiment of the present application. As shown in FIGS. 1 and 2A to 2K, the method for forming a capacitor array structure according to an embodiment of the present application includes the following steps:

S11: providing a substrate 20, a capacitor contact 21 being exposed on a surface of the substrate, the substrate 20 including an array region AA and a peripheral region PA, and the capacitor contact 21 being located at the array region AA, as shown in FIG. 2A.

Specifically, as shown in FIG. 2A, the array region AA and the peripheral region PA may be isolated from each other by a shallow trench isolation structure (not shown). The array region AA is configured to form a capacitor array, and a conductive structure, such as a transistor, or the like, may be formed inside the peripheral region PA of the substrate 20 and configured to be electrically connected with a subsequent conductive contact plug. The capacitor contact 21 extends out of the substrate 20 from the inside of the substrate 20 in a direction perpendicular to the substrate. In an embodiment of the present application, the substrate 20 may include an insulating material (for example, a silicon nitride material) and is configured to electrically isolate the adjacent capacitor contacts 21. The capacitor contact 21 may be made of a metal (for example, tungsten) conductive material.

Figure 2B:
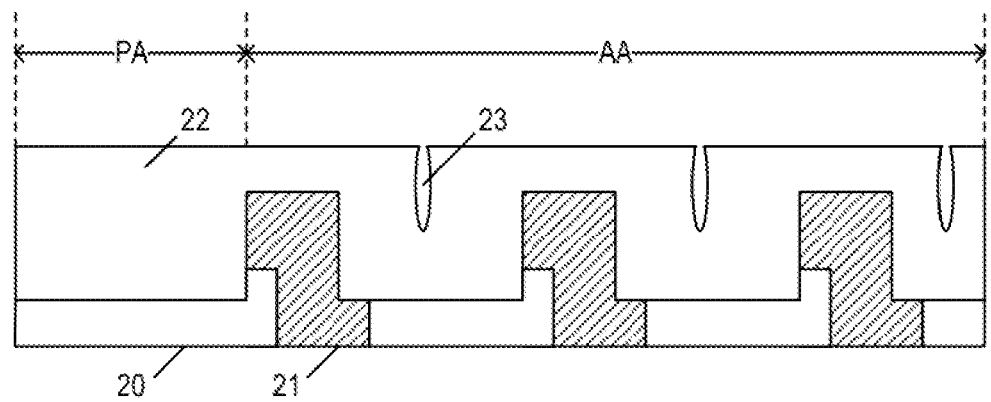
FIG. 2B is a second schematic sectional view of main processes for forming a capacitor array structure according to an embodiment of the present application.

S12: forming a bottom supporting layer 22 covering the substrate 20 and the capacitor contact 21, the bottom supporting layer 22 having a gap 23 therein, as shown in FIG. 2B.

Specifically, the bottom supporting layer 22 is deposited on the surface of the substrate 20 using an atomic layer deposition process, such that the bottom supporting layer 22 covers the surface of the substrate 20 and a surface of the exposed capacitor contact 21. Due to limitations of the atomic layer deposition process, the formed bottom supporting layer 22 has an air gap (i.e., the gap 23) extending from a surface of the bottom supporting layer 22 facing away from the substrate 20 to an interior of the bottom supporting layer 22. On the one hand, the existence of the gap 23 may affect a stability of the whole capacitor array structure; on the other hand, a dielectric layer material with a high dielectric constant deposited in a subsequent process may diffuse into the gap 23, thereby forming a parasitic capacitance with the capacitor contact 21.

Figure 2C:
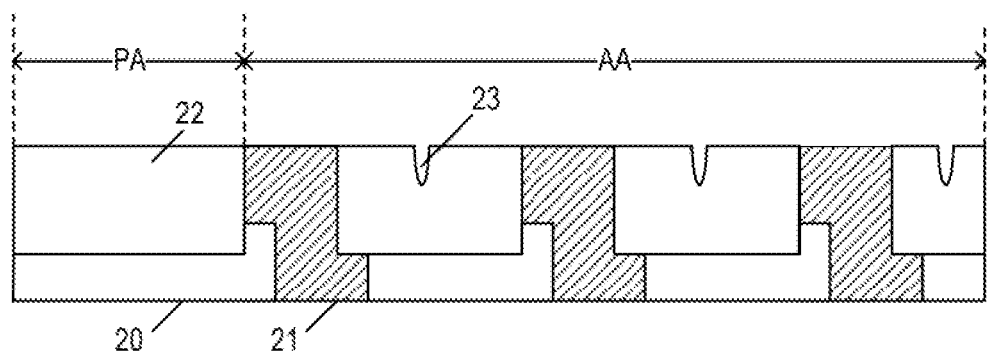
FIG. 2C is a third schematic sectional view of main processes for forming a capacitor array structure according to an embodiment of the present application.
Figure 2D:
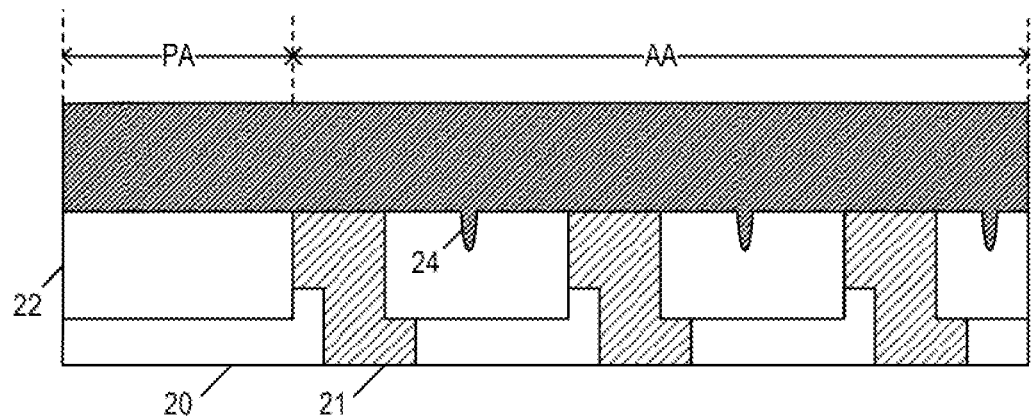
FIG. 2D is a fourth schematic sectional view of main processes for forming a capacitor array structure according to an embodiment of the present application.
Figure 2E:
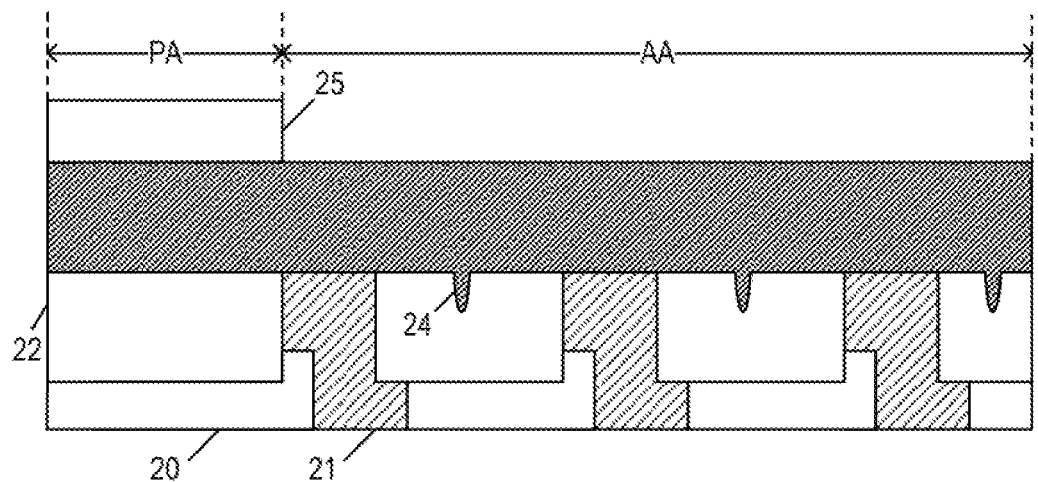
FIG. 2E is a fifth schematic sectional view of main processes for forming a capacitor array structure according to an embodiment of the present application.
Figure 2F:
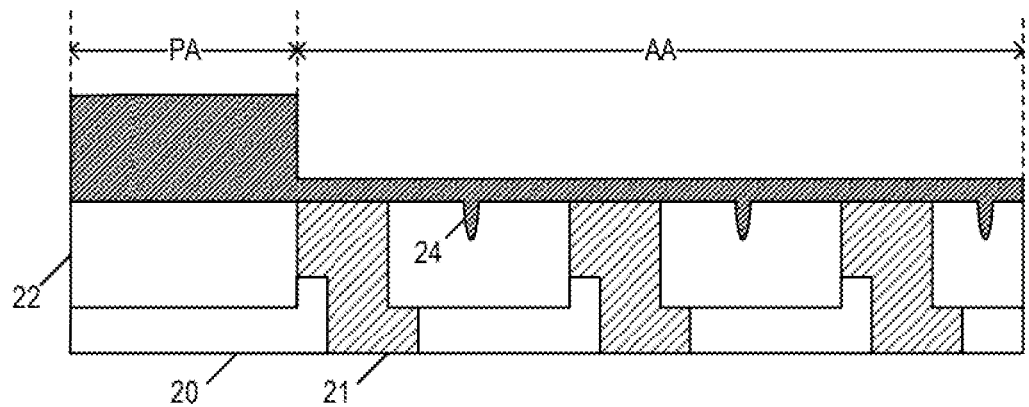
FIG. 2F is a sixth schematic sectional view of main processes for forming a capacitor array structure according to an embodiment of the present application.

S13: forming a filling layer 24 filling the gap 23 and covering the capacitor contact 21 and the surface of the bottom supporting layer 22, a thickness of the filling layer 24 located at the peripheral region PA being larger than that of the filling layer 24 located at the array region AA, as shown in FIG. 2F.

Optionally, the step of forming the filling layer 24 filling the gap 23 and covering the capacitor contact 21 and the surface of the bottom supporting layer 22 includes:
  etching back the bottom supporting layer 22 to expose the capacitor contact 21, as shown in FIG. 2C; and
  forming the filling layer 24 filling the gap 23 and covering the capacitor contact 21 and the surface of the bottom supporting layer 22, as shown in FIG. 2D.

Specifically, after formed, the bottom supporting layer 22 with the gap 23 is etched back with the capacitor contact 21 as an etching stop layer, so as to expose the capacitor contact 21, thereby forming the structure shown in FIG. 2C. The back etching action is performed to avoid that a top of the gap 23 (i.e., a part located at the surface of the bottom supporting layer 22) is too small to fill the gap 23 sufficiently. Then, the filling layer 24 is deposited in the gap 23, and on the exposed surface of the capacitor contact 21, and the surface of the bottom supporting layer 22 facing away from the substrate 20 using a thin film process (for example, a chemical vapor deposition process, a physical vapor deposition process, or an atomic layer deposition process, or the like), so as to form the structure shown in FIG. 2D.

In FIGS. 2A to 2K of an embodiment of the present application, a description is given with the filling layer 24 having a single-layer structure as an example, so as to simplify a manufacturing process. The filling layer 24 may be set into a multi-layer structure according to actual needs by those skilled in the art. FIG. 3 is a schematic diagram of another capacitor array structure according to an embodiment of the present application. Optionally, the step of forming the filling layer 24 filling the gap 23 and covering the capacitor contact 21 and the surface of the bottom supporting layer 22 includes:
  forming a first sublayer 241 filling the gap 23;
  forming a second sublayer 242 covering the capacitor contact 21, the bottom supporting layer 22 and a surface of the first sublayer 241 to form the filling layer 24 including the first sublayer 241 and the second sublayer 242.

In an embodiment of the present application, those skilled in the art may control the first sublayer 241 to only fill the gap 23 by combining deposition and back etching processes, so as to improve the stability of the overall structure of the bottom supporting layer 22, and meanwhile prevent subsequent materials from entering the gap 23; the second sublayer 242 covers the capacitor contact 21, the bottom supporting layer 22 and the surface of the first sublayer 241, so as to further prevent subsequent process materials from entering the gap 23. The first sublayer 241 and the second sublayer 242 may be made of a same material or different materials (for example, the first sublayer 241 and the second sublayer 242 are made of one or any combination of silicon nitride, polycrystalline silicon, silicon oxynitride, and silicon carbonitride). In an embodiment of the present application, the filling layer 24 is set into a double-layer structure, such that the stability of the whole capacitor array structure may be enhanced while the delay effect of the capacitor array structure is reduced sufficiently.

Optionally, the filling layer 24 is made of one or any combination of silicon nitride, polycrystalline silicon, silicon oxynitride, and silicon carbonitride.

A relative size relationship between the thickness of the filling layer 24 located at the array region AA and the thickness of the filling layer 24 located at the peripheral region PA may be selected by those skilled in the art according to actual needs. Optionally, the thickness of the filling layer 24 located at the peripheral region PA is 10 nm to 40 nm greater than the thickness of the filling layer 24 located at the array region AA.

Specifically, after formation of the filling layer 24 filling the gap 23 and covering the capacitor contact 21 and the surface of the bottom supporting layer 22, the filling layer 24 has flush top surfaces at the array region AA and the peripheral region PA. Then, a photoresist layer 25 covering the filling layer 24 located on the surface of the peripheral region PA is formed, as shown in FIG. 2E; next, the filling layer 24 at the array region AA is etched to reduce the thickness thereof, such that the top surface of the filling layer 24 at the array region AA is located below the top surface of the filling layer 24 at the peripheral region PA, and the thickness of the filling layer 24 located at the peripheral region PA is 10 nm to 40 nm greater than the thickness of the filling layer 24 located at the array region AA. Further, the thickness of the filling layer 24 located at the peripheral region PA is 20 nm to 30 nm greater than the thickness of the filling layer 24 located at the array region AA. For example, the filling layer 24 located at the peripheral region PA has a thickness of 40 nm to 60 nm, and the filling layer 24 located at the array region AA has a thickness of 15 nm to 35 nm.

In an embodiment of the present application, the thickness of the filling layer 24 at the array region AA is reduced, so as to subsequently form a capacitor hole by an etching action, which solves an insufficient etching problem in the etching process of the capacitor hole, and meanwhile facilitates an increase in the size of a bottom of the formed capacitor hole, thereby increasing a contact area between a lower electrode and the capacitor contact 21, and reducing a contact resistance. In addition, in an embodiment of the present application, by increasing the thickness of the filling layer 24 at the peripheral region PA, in a subsequent process of removing a sacrificial layer using a chemical reagent, it may be avoided that, due to a defect in the subsequent process, the chemical reagent enters the peripheral region PA, etches the filling layer 24 and the bottom supporting layer 22, and finally damages the conductive structure at the bottom of the peripheral region PA; moreover, in a subsequent process of forming a conductive plug contact hole in the peripheral region PA, the increase in the thickness of the filling layer 24 at the peripheral region PA facilitates an increase in a process window and reduction of a process difficulty.

S14: forming supporting layers and sacrificial layers alternately stacked in a direction perpendicular to the substrate 20.

Figure 2G:
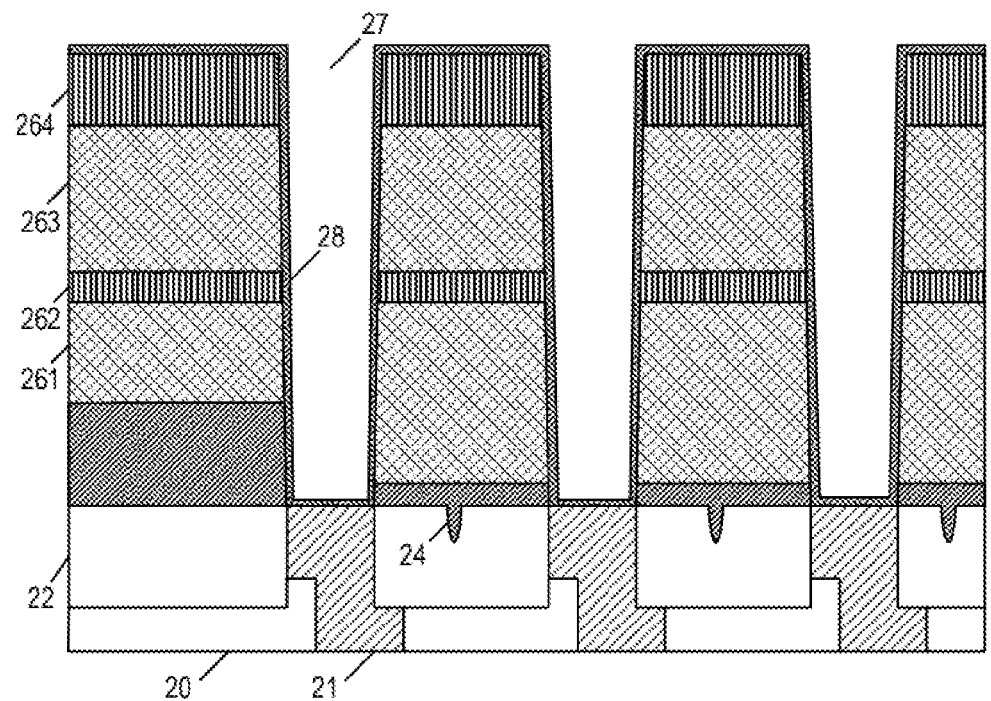
FIG. 2G is a seventh schematic sectional view of main processes for forming a capacitor array structure according to an embodiment of the present application.
Figure 3:
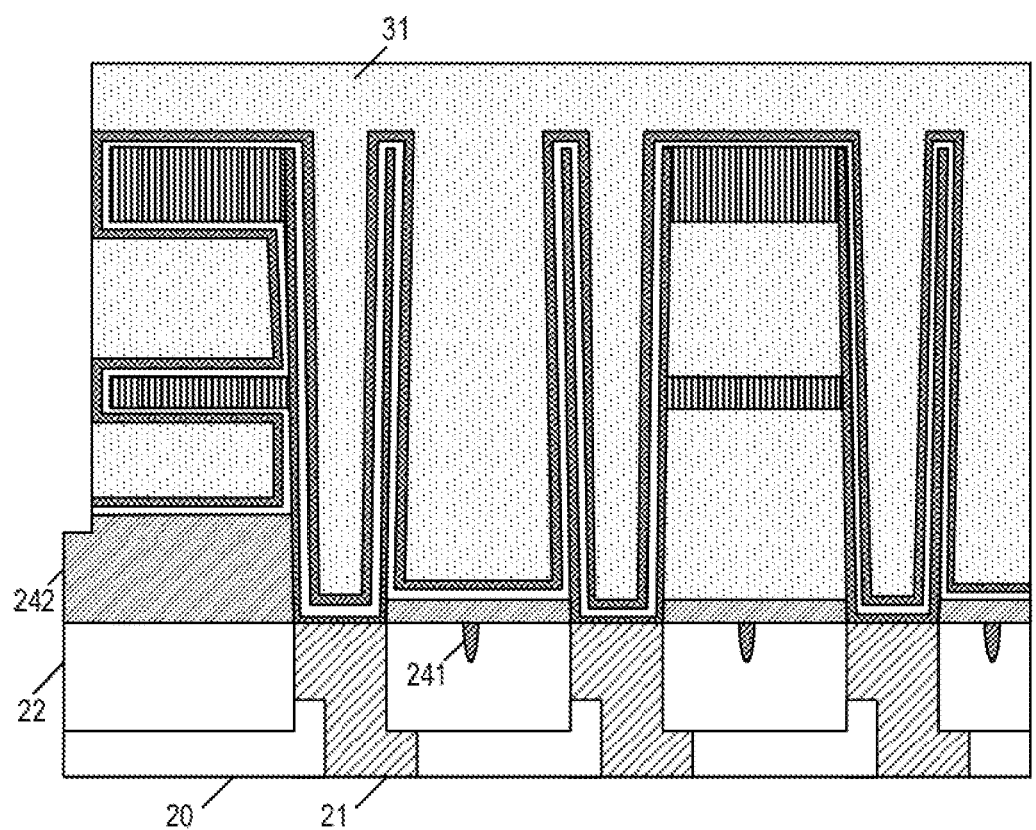
FIG. 3 is a schematic diagram of another capacitor array structure according to an embodiment of the present application.

S15: forming a capacitor hole 27 at least penetrating through the supporting layer and the sacrificial layer and exposing the capacitor contact 21, as shown in FIG. 2G.

Optionally, the step of forming a capacitor hole 27 at least penetrating through the supporting layer and the sacrificial layer and exposing the capacitor contact 21 includes:

forming, in the array region AA, the capacitor hole 27 penetrating through the supporting layer, the sacrificial layer and the filling layer 24 and exposing the capacitor contact 21.

Specifically, the sacrificial layers and the supporting layers are alternately deposited in the direction perpendicular to the substrate 20, and the numbers of the alternately deposited sacrificial layers and supporting layers may be selected by those skilled in the art according to actual needs. The deposited supporting layer may has a same material as the bottom supporting layer 22; for example, both are made of nitride materials (e.g., silicon nitride); the deposited sacrificial layer may be made of an oxide material (e.g., silicon oxide). In an embodiment of the present application, the description is given with formation of a first sacrificial layer 261, a middle supporting layer 262, a second sacrificial layer 263 and a top supporting layer 264 as an example, as shown in FIG. 2G. Then, the top supporting layer 264, the second sacrificial layer 263, the middle supporting layer 262, the first sacrificial layer 261 and the filling layer 24 are etched using a dry etching process to form the capacitor hole 27 exposing the capacitor contact 21, as shown in FIG. 2G.

Figure 2H:
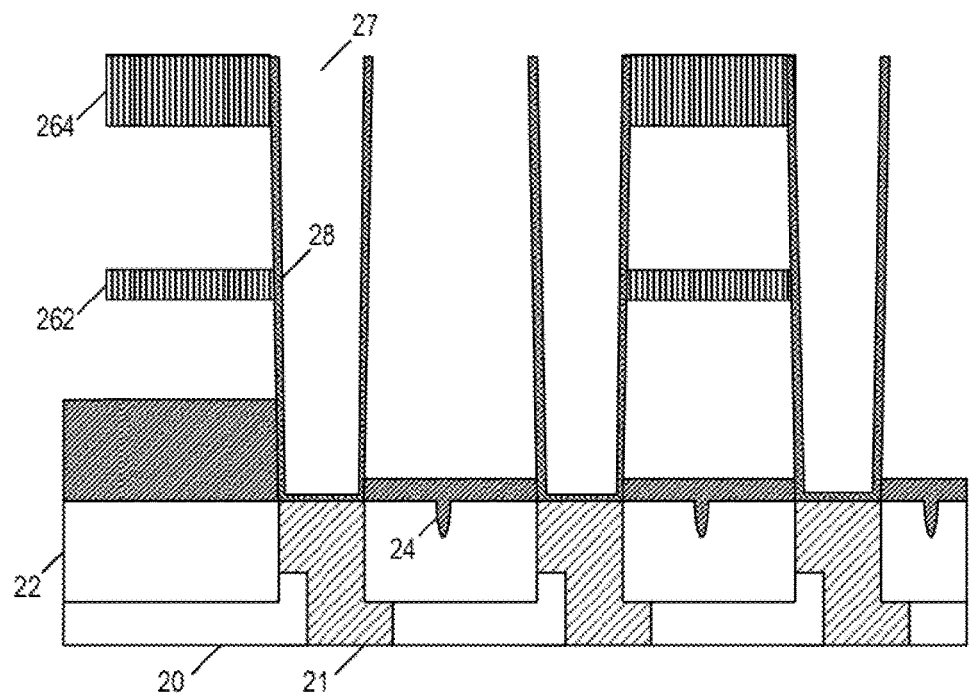
FIG. 2H is an eighth schematic sectional view of main processes for forming a capacitor array structure according to an embodiment of the present application.
Figure 2I:
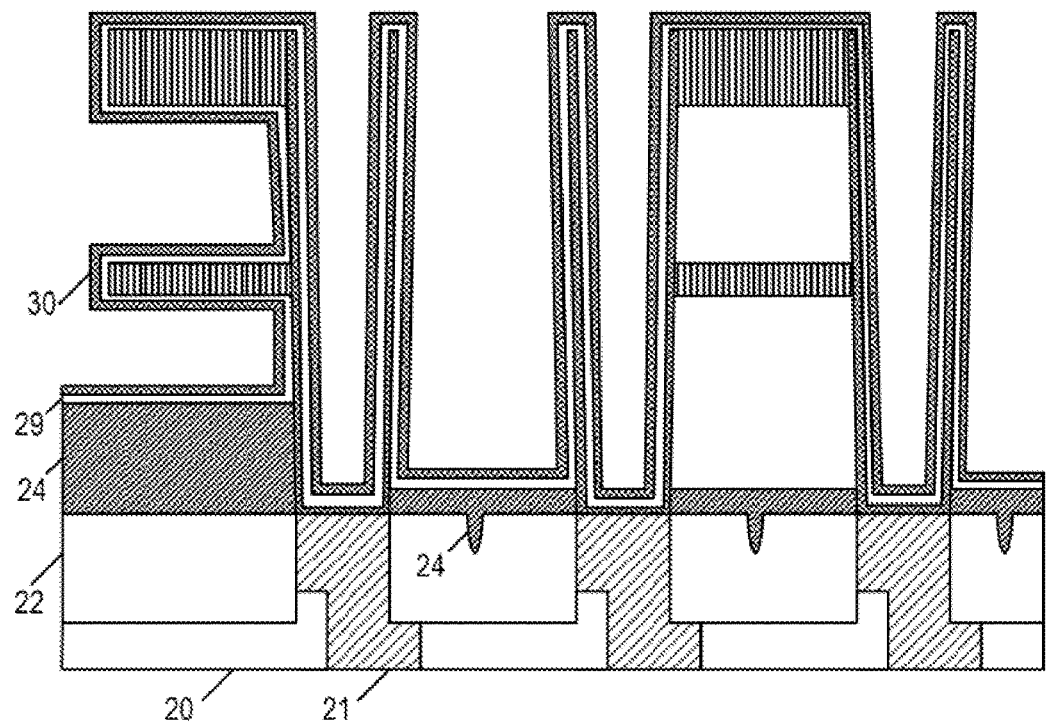
FIG. 2I is a ninth schematic sectional view of main processes for forming a capacitor array structure according to an embodiment of the present application.

S16: sequentially forming a lower electrode layer 28 on an inner wall of the capacitor hole 27, a dielectric layer 29 on a surface of the lower electrode layer 28 and an upper electrode layer 30 on a surface of the dielectric layer 29 to form a capacitor, as shown in FIG. 2I.

Optionally, the step of forming a capacitor includes:
forming the lower electrode layer 28 on the inner wall of the capacitor hole 27, as shown in FIG. 2G;
removing part of the supporting layers and all the sacrificial layers to expose the filling layer 24, as shown in FIG. 2H; and
forming the dielectric layer 29 covering the surface of the lower electrode layer 28 and the surface of the filling layer 24 and the upper electrode layer 30 covering the surface of the dielectric layer 29, as shown in FIG. 2I.

Specifically, after the capacitor hole 27 is formed, first, the lower electrode layer 28 is formed on the inner wall of the capacitor hole 27 and a surface of the top supporting layer 264 using a chemical vapor deposition or physical vapor deposition or atomic layer deposition process. Then, a mask layer is formed on the top supporting layer 264, the mask layer having therein an opening including the capacitor hole 27. One opening may be overlapped with more than one or two capacitor holes 27. Next, the lower electrode layer 28 covering the surface of the top supporting layer 264 and a part of the top supporting layer 264 are etched along the opening to expose the second sacrificial layer 263; then, the second sacrificial layer 263 is removed along the opening using an acidic reagent (for example, HF) to expose the middle supporting layer 262; then, a part of the middle supporting layer 262 is etched away along the opening to expose the first sacrificial layer 261; and finally, the first sacrificial layer 261 is removed along the opening using an acidic reagent (for example, HF), so as to obtain the structure shown in FIG. 2H.

During the etching process of the capacitor hole 27, polymer particles tend to adhere to a side wall of the capacitor hole 27, resulting in a poor deposition quality of the lower electrode layer 28 in the vicinity thereof (for example, the side wall of the capacitor hole 27 may be formed with a hole region not covered with the lower electrode layer 28). Then, when the second sacrificial layer 263 is removed, the acidic reagent may permeate into the hole region to etch the first sacrificial layer 261, and further, when the first sacrificial layer 261 is removed subsequently, since only a small quantity of sacrificial layer materials remain, if the filling layer 24 does not exist or has an insufficient thickness, the acidic reagent may continuously etch the bottom supporting layer 22 below, and finally, the conductive structure at the bottom of the peripheral region PA is damaged. In one embodiment of the present application, the barrier of the filling layer 24 prevents the acidic agent from permeating into the bottom supporting layer 22, thus protecting the bottom structure.

Next, a dielectric layer material with a high dielectric constant is sequentially deposited on the surface of the lower electrode layer 28 (including an inner surface, an outer surface and a top surface of the lower electrode layer 28), the remaining surface of the supporting layer, and the exposed surface of the filling layer 24 to form the dielectric layer 29; and then a conductive material is deposited on the surface of the dielectric layer 29 to form the upper electrode layer 30, as shown in FIG. 2I. The upper electrode layer 30 may have a same material as the lower electrode layer 28, for example, titanium nitride.

Figure 2J:
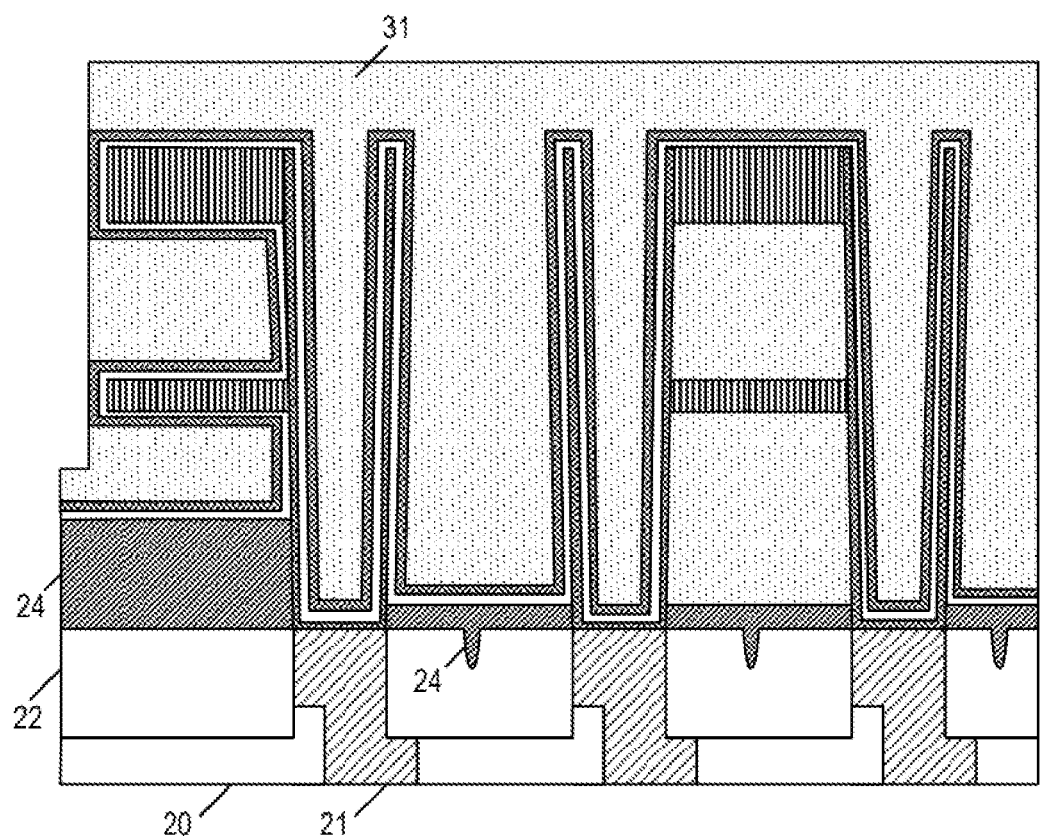
FIG. 2J is a tenth schematic sectional view of main processes for forming a capacitor array structure according to an embodiment of the present application.

After formation of the upper electrode layer 30, a conductive layer 31 may be further formed on the surface of the upper electrode layer 30 to improve the stability of the capacitor array structure. The conductive layer 31 covers the surface of the upper electrode layer 30 and fills a groove in the upper electrode layer 30, thus smoothing a top surface of the capacitor, as shown in FIG. 2J. The conductive layer 31 may be made of GeSi or doped polycrystalline silicon. Then, the conductive layer 31, the upper electrode layer 30, and the dielectric layer 29 at a part of the peripheral region PA are etched with the filling layer 24 as an etching stop layer, thereby forming the structure shown in FIG. 2K.

Figure 2K:
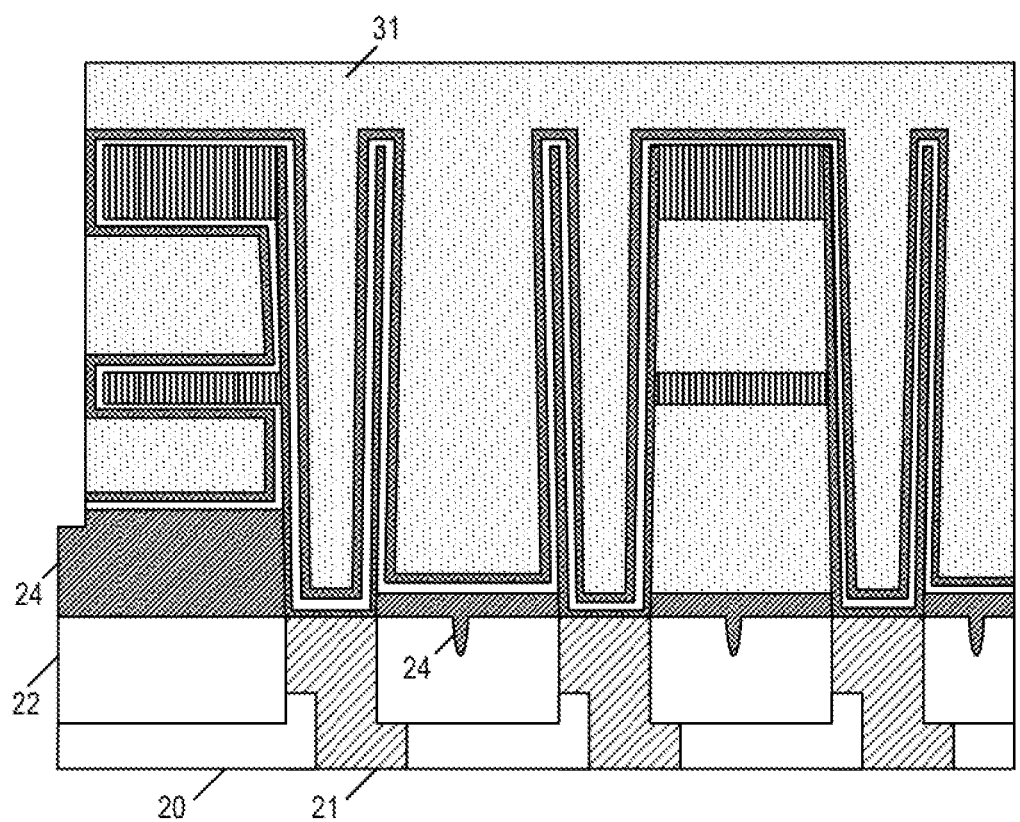
FIG. 2K is an eleventh schematic sectional view of main processes for forming a capacitor array structure according to an embodiment of the present application.

Moreover, an embodiment of the present application further provides a capacitor array structure. The capacitor array structure according to an embodiment of the present application may be formed using the method shown in FIGS. 1 and 2A to 2K, and a schematic diagram of the final capacitor array structure is shown in FIG. 2K or 3. As shown in FIGS. 1, 2A to 2K and 3, the capacitor array structure according to an embodiment of the present application includes:

a substrate 20, a capacitor contact 21 being exposed on a surface of the substrate 20, the substrate 20 including an array region AA and a peripheral region PA, and the capacitor contact 21 being located at the array region AA;

a bottom supporting layer 22 covering a surface of the substrate 20 and a side wall of the capacitor contact 21, the bottom supporting layer 22 having a gap 23 therein;

a filling layer 24 filling the gap 23 and covering the capacitor contact 21 and a surface of the bottom supporting layer 22, a thickness of the filling layer 24 located at the peripheral region PA being larger than that of the filling layer 24 located at the array region AA;

a capacitor including a lower electrode layer 28 located on the substrate 20 and electrically connected to the capacitor contact 21, a dielectric layer 29 covering a surface of the lower electrode layer 28 and an upper electrode layer 30 covering a surface of the dielectric layer 29; and a plurality of supporting layers connected to a side wall of the lower electrode layer 28.

Optionally, the thickness of the filling layer 24 located at the peripheral region is 10 nm to 40 nm greater than the thickness of the filling layer 24 located at the array region. Further, the thickness of the filling layer 24 located at the peripheral region is 20 nm to 30 nm greater than the thickness of the filling layer 24 located at the array region.

Optionally, the dielectric layer 29 further covers a surface of the filling layer 24 and a surface of the supporting layer; the capacitor array structure further includes:
 a conducting layer 31 covering a surface of the upper electrode layer 30.

Optionally, the filling layer 24 includes:
 a first sublayer 241 filling the gap 23; and
 a second sublayer 242 covering the bottom supporting layer 22, the capacitor contact 21 and a surface of the first sublayer 241.

Optionally, the filling layer 24 is made of one or any combination of silicon nitride, polycrystalline silicon, silicon oxynitride, and silicon carbonitride.

With the capacitor array structure and the method for forming the same according to an embodiment of the present application, the filling layer is formed to fill the gap in the bottom supporting layer, thereby reducing or even avoiding the problem that the dielectric layer diffuses to the bottom supporting layer and forms the parasitic capacitance with the capacitor contact in the process of forming the dielectric layer, alleviating the delay effect of the capacitor array structure, and improving the performance of the DRAM.

The above is only preferred implementations of the application. It shall be pointed out that those skilled in the art may also make some improvements and modifications without departing from the principle of the application. These improvements and modifications shall fall within the protective scope of the application.

What is claimed is:

1. A method for forming a capacitor array structure, comprising the following steps:
 providing a substrate, a capacitor contact being exposed on a surface of the substrate, the substrate comprising an array region and a peripheral region, and the capacitor contact being located at the array region;
 forming a bottom supporting layer covering the substrate and the capacitor contact, the bottom supporting layer having a gap therein;
 forming a filling layer filling the gap and covering the capacitor contact and the surface of the bottom supporting layer, a thickness of the filling layer located at the peripheral region being larger than that of the filling layer located at the array region;
 forming supporting layers and sacrificial layers alternately stacked in a direction perpendicular to the substrate;
 forming a capacitor hole at least penetrating through the supporting layer and the sacrificial layer and exposing the capacitor contact; and
 sequentially forming a lower electrode layer on an inner wall of the capacitor hole, a dielectric layer on a surface of the lower electrode layer and an upper electrode layer on a surface of the dielectric layer to form a capacitor.

2. The method according to claim 1, wherein the step of forming the filling layer filling the gap and covering the capacitor contact and the surface of the bottom supporting layer comprises:
 etching back the bottom supporting layer to expose the capacitor contact; and
 forming the filling layer filling the gap and covering the capacitor contact and the surface of the bottom supporting layer.

3. The method according to claim 2, wherein the step of forming the filling layer filling the gap and covering the capacitor contact and the surface of the bottom supporting layer comprises:
 forming a first sublayer filling the gap;
 forming a second sublayer covering the capacitor contact, the bottom supporting layer and a surface of the first sublayer to form the filling layer comprising the first sublayer and the second sublayer.

4. The method according to claim 1, wherein the thickness of the filling layer located at the peripheral region is 10 nm to 40 nm greater than the thickness of the filling layer located at the array region.

5. The method according to claim 1, wherein the step of forming a capacitor hole at least penetrating through the supporting layer and the sacrificial layer and exposing the capacitor contact comprises:
 forming, in the array region, the capacitor hole penetrating through the supporting layer, the sacrificial layer and the filling layer and exposing the capacitor contact.

6. The method according to claim 1, wherein the step of forming a capacitor comprises:
 forming the lower electrode layer on the inner wall of the capacitor hole;
 removing part of the supporting layers and all the sacrificial layers to expose the filling layer; and
 forming the dielectric layer covering the surface of the lower electrode layer and the surface of the filling layer and the upper electrode layer covering the surface of the dielectric layer.

7. The method according to claim 1, wherein the filling layer is made of one or any combination of silicon nitride, polycrystalline silicon, silicon oxynitride, and silicon carbonitride.

8. A capacitor array structure, comprising:
 a substrate, a capacitor contact being exposed on a surface of the substrate, the substrate comprising an array region and a peripheral region, and the capacitor contact being located at the array region;
 a bottom supporting layer covering a surface of the substrate and a side wall of the capacitor contact, the bottom supporting layer having a gap therein;
 a filling layer filling the gap and covering the capacitor contact and the surface of the bottom supporting layer, a thickness of the filling layer located at the peripheral region being larger than that of the filling layer located at the array region;
 a capacitor comprising a lower electrode layer located on the substrate and electrically connected to the capacitor contact, a dielectric layer covering a surface of the lower electrode layer and an upper electrode layer covering a surface of the dielectric layer; and
 a plurality of supporting layers connected to a side wall of the lower electrode layer.

9. The structure according to claim 8, wherein the thickness of the filling layer located at the peripheral region is 10 nm to 40 nm greater than the thickness of the filling layer located at the array region.

10. The structure according to claim 8, wherein the dielectric layer further covers a surface of the filling layer and a surface of the supporting layer; the capacitor array structure further comprises:
 a conducting layer covering a surface of the upper electrode layer.

11. The structure according to claim 8, wherein the filling layer comprises:
 a first sublayer filling the gap; and a second sublayer covering the bottom supporting layer, the capacitor contact and a surface of the first sublayer.

12. The structure according to claim 8, wherein the filling layer is made of one or any combination of silicon nitride, polycrystalline silicon, silicon oxynitride, and silicon carbonitride.

\* \* \* \* \*